(12) United States Patent
Poole

(10) Patent No.: US 6,577,225 B1
(45) Date of Patent: Jun. 10, 2003

(54) ARRAY RESISTOR NETWORK

(75) Inventor: David L. Poole, Portland, IN (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/135,637

(22) Filed: Apr. 30, 2002

(51) Int. Cl.[7] .................................................. H01C 1/01
(52) U.S. Cl. ........................ 338/320; 338/203; 338/322; 338/325; 338/260
(58) Field of Search ................................ 338/239, 221, 338/260, 203, 320, 319, 322, 325; 29/620

(56) References Cited

U.S. PATENT DOCUMENTS

| | | | | |
|---|---|---|---|---|
| 3,964,087 A | * | 6/1976 | Mallon | ........................ 338/320 |
| 4,486,738 A | * | 12/1984 | Sadlo et al. | ................. 338/320 |
| 5,285,184 A | | 2/1994 | Hatta | |
| 5,331,305 A | | 7/1994 | Kanbara | |
| 5,334,968 A | | 8/1994 | Negoro | |
| 5,661,450 A | * | 8/1997 | Davidson | ..................... 338/320 |
| 5,850,171 A | * | 12/1998 | Lin et al. | ..................... 338/320 |
| 5,977,863 A | | 11/1999 | Bloom | |
| 5,981,393 A | | 11/1999 | Liao | |
| 5,982,273 A | * | 11/1999 | Shibata | ........................ 338/320 |
| 6,005,474 A | | 12/1999 | Takeuchi | |
| 6,128,199 A | * | 10/2000 | Kambara | ..................... 338/320 |
| 6,246,312 B1 | | 6/2001 | Poole | |

* cited by examiner

*Primary Examiner*—Karl D. Easthom
(74) *Attorney, Agent, or Firm*—Mark P. Bourgeois

(57) ABSTRACT

An array resistor network that has a high density of resistors per unit area. The array resistor network includes a ceramic substrate having a top and bottom surface. Apertures extend through the substrate between the top and bottom surfaces. Recesses are located on opposite edges of the substrate. Resistors are located on the top surface. Each resistor is located between a recess and an apertures. Inner conductors are connected to one end of the resistors. The Inner conductors are located on the top surface and extend through the aperture onto the bottom surface. Outer conductors are connected to another end of the resistors. The outer conductors are located on the top surface and extend along the recess onto the second surface.

15 Claims, 8 Drawing Sheets

ARRAY RESISTOR NETWORK

BACKGROUND

1. Field of the Invention

This invention generally relates to resistors for electronics. Specifically, the invention is a group of resistors mounted in a high density network or array package.

2. Description of the Related Art

Resistor networks are commonly used to terminate high speed digital signal lines to minimize unwanted reflections back through the transmission structure which is typically a printed circuit board. In most applications, the terminations are made by placing a resistor with a resistance matching the impedance of the transmission line, at the end of the transmission line. One end of the resistor is connected to a common termination voltage and the other end is connected to the signal line. For these applications, a bussed resistor network is a convenient solution, since one end of the termination is common to all signal lines.

The previous resistor network designs include surface mount, through hole SIP and DIP versions and chip resistor arrays.

Despite the advantages of each type of prior art resistor network, there is still difficulty in economically manufacturing resistors with a high density of interconnects per unit area. In particular, providing electrical connections only on the periphery of the resistor network causes the electrical leads to be tightly spaced on the edge of the device, while the area in the interior of the device is unused for electrical interconnections.

Therefore, there is a current unmet and heretofore long felt need for a resistor network with higher density that can be manufactured at low cost.

SUMMARY

It is a feature of the invention to provide an array resistor network that has a high density of resistors per unit area.

It is a feature of the invention to provide an array resistor network that includes a substrate that has a first and a second surface and first, second, third and fourth edges. Several apertures extend through the substrate between the first and second surfaces. Several recesses are located in the first and second edges. Several resistors are disposed on the first surface. Each resistor is located between the recess and the apertures. Several first conductors are connected to a first end of the resistors. The first conductors are located on the first surface and extend through the aperture onto the second surface. Several second conductors are connected to a second end of the resistors. The second conductors are located on the first surface and extend through the recess onto the second surface.

Figure 1:
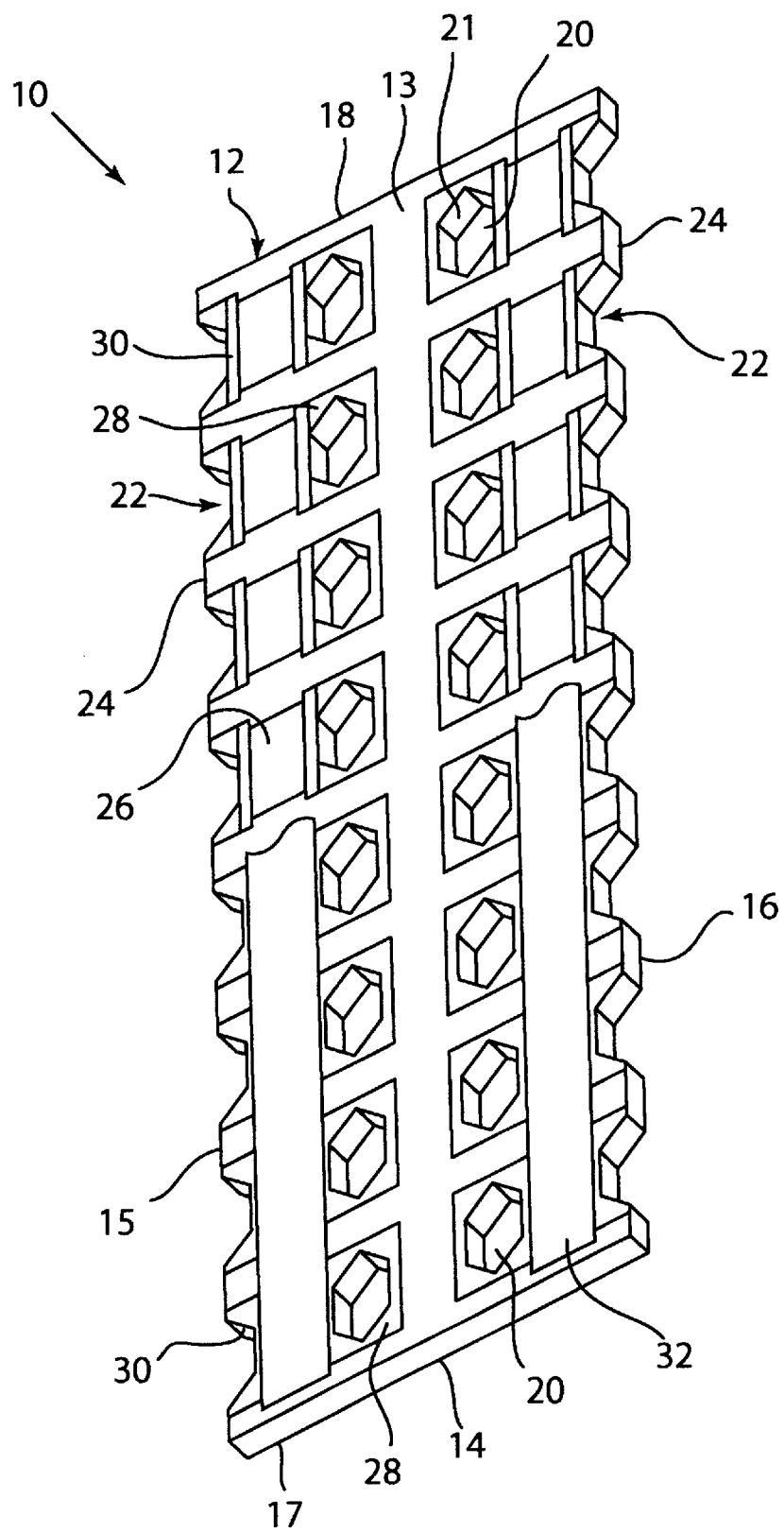
FIG. 1 is a perspective view of an array resistor network.
Figure 2:
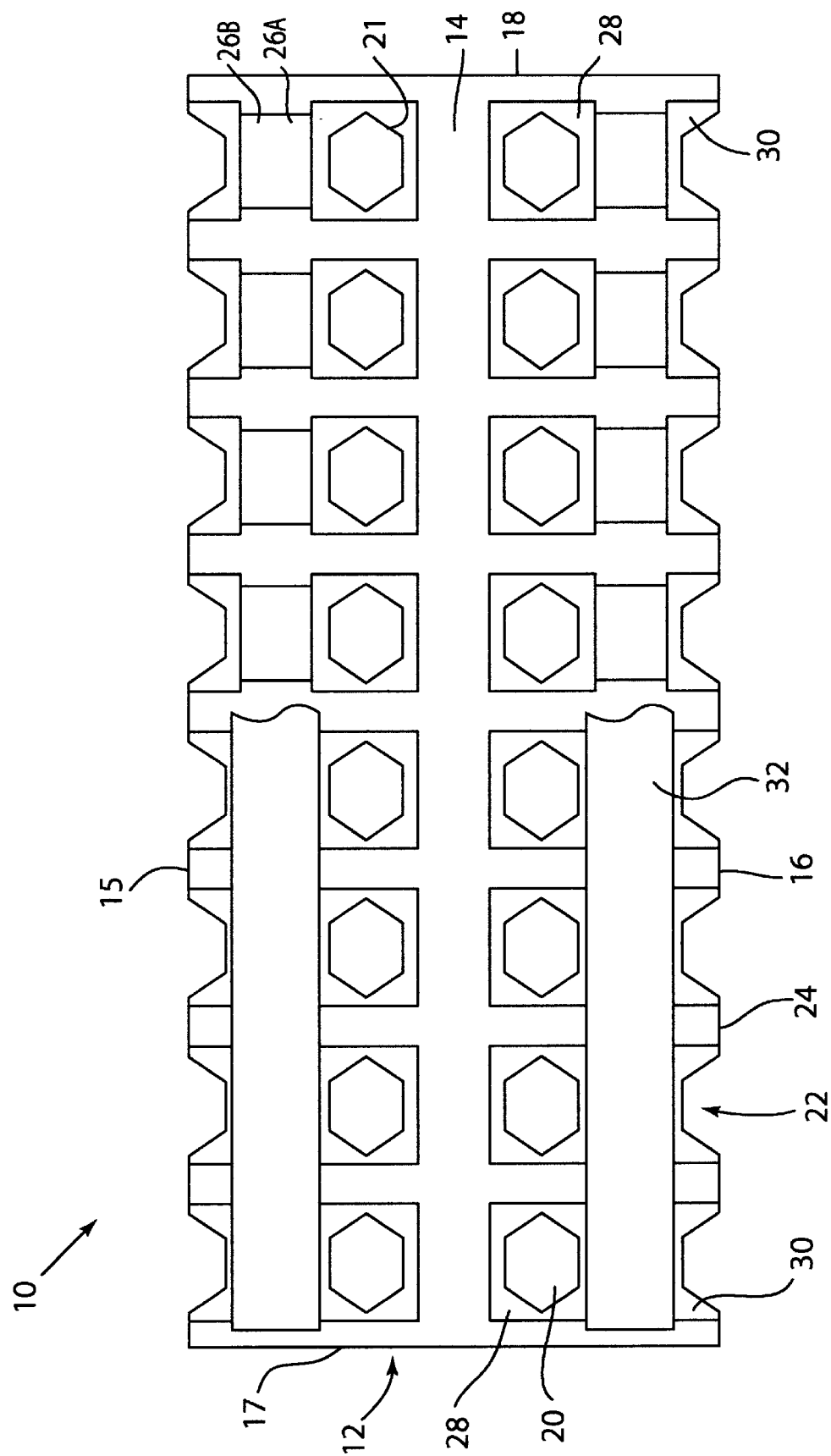
FIG. 2 is a top view of FIG. 1.
Figure 3:
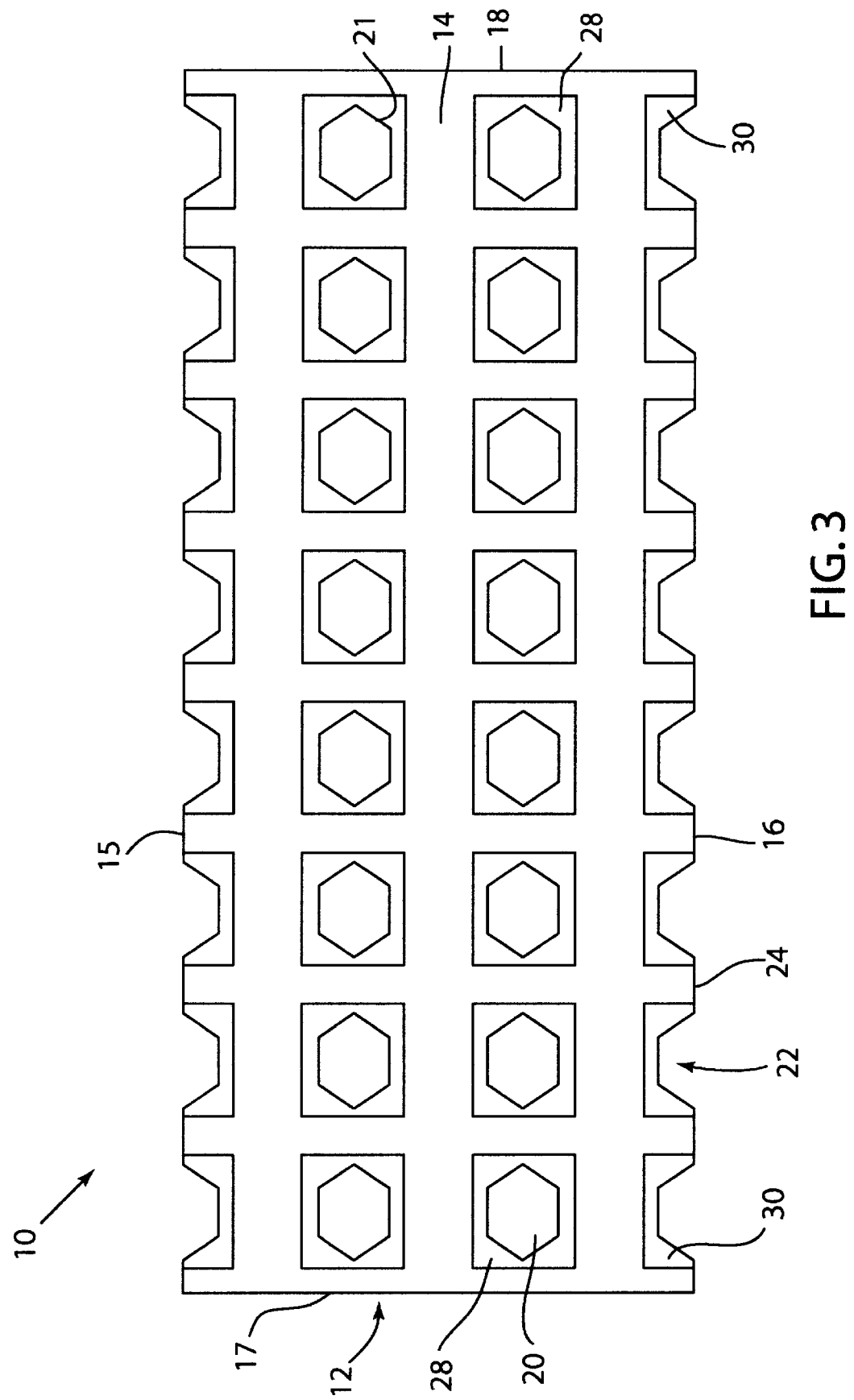
FIG. 3 is a bottom view of FIG. 1.
Figure 4:
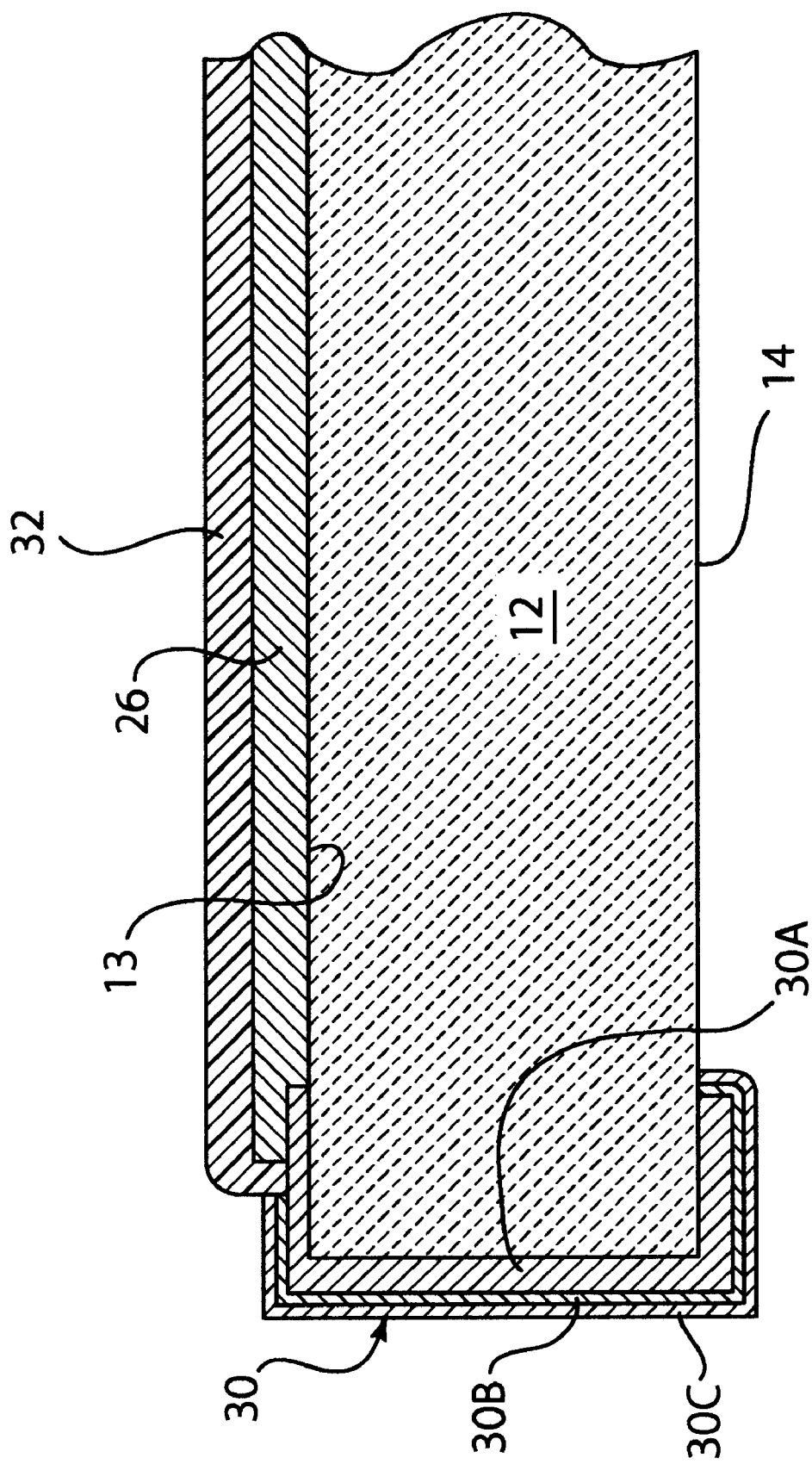
FIG. 4 is a cross-sectional view of FIG. 1.

It is noted that the drawings of the invention are not to scale.

DETAILED DESCRIPTION

Referring to FIGS. 1–4, there is an array resistor network assembly 10 shown. In particular, resistor network assembly 10 has a planar substrate 12 having a top surface 13 and a bottom surface 14. Substrate 12 is preferably made out of a ceramic material such as alumina oxide and is commercially available from many vendors. Substrate 12 would be purchased molded and fired to shape including the apertures. Substrate 12 can also be laser machined. Substrate 12 has side edges 15, 16, 17 and 18. Two rows of apertures 20 extend through substrate 12 and are oriented parallel to edges 15 and 16. Apertures 20 have side walls 21. Recesses 22 are located along edges 15 and 16. Projections 24 are located between recesses 22. Resistors 26 are located on top surface 13. Resistors 26 are conventional thick film resistors and are formed from materials such as Ruthenium Oxide that are available from Dupont Corporation. Resistors 26 have a first end 26A and a second end 26B. The resistors may be laser trimmed in order to increase the accuracy of their resistance value.

An inner conductor 28 is electrically connected to resistor end 26A. Inner conductor 28 connects to end 26A and extends around and down through aperture 20 along wall 21 onto an area of bottom surface 14. Inner conductor 28 makes an electrical connection from the resistor on the top surface to the bottom surface where it would be soldered to a contact on an external circuit board (not shown). An outer conductor 30 is electrically connected to resistor end 26B. Outer conductor 30 connects to end 26B and extends around and down across recess 22 onto an area of bottom surface 14. Outer conductor 30 makes an electrical connection from the resistor on the top surface to the bottom surface where it would be soldered to a contact on an external circuit board (not shown). Projection 24 insulates adjacent conductors 30 from each other.

Conductors 28 and 30 are comprised of multiple layers. The layers are shown for outer conductor 30 in FIG. 4. Outer conductor 30 has a silver thick film layer 30A, an electroplated nickel layer 30B and an electroplated solder layer 30C. Similarly, inner conductor 28 has a silver thick film layer 28A, an electroplated nickel layer 28B and an electroplated solder layer 28C (not shown).

Layers 28A and 30A are formed from a conventional thick film conductor material such as a silver paste. Layers 28A and 30A are produced using conventional thick film conductor processing techniques such as screen printing. Layers 28A, 30A and resistors 26 slightly overlap and sinter to form a mechanical and electrical bond during processing. Layers 28B and 30B are an electroplated nickel layer. The nickel layer prevents removal of the thick film silver by leaching during later soldering operations. Layer 28C and 30C are an electroplated solder layer. The composition of the solder layer is a high temperature solder and ranges from 5–20% lead and from 80–95% tin. The preferred solder composition is 10% lead and 90% tin. An organic cover coat 32 such as an epoxy is placed over the resistors 26 to protect from corrosion and abrasion. The cover coat 32 is shown partially removed in order to view the resistors underneath.

Figure 5:
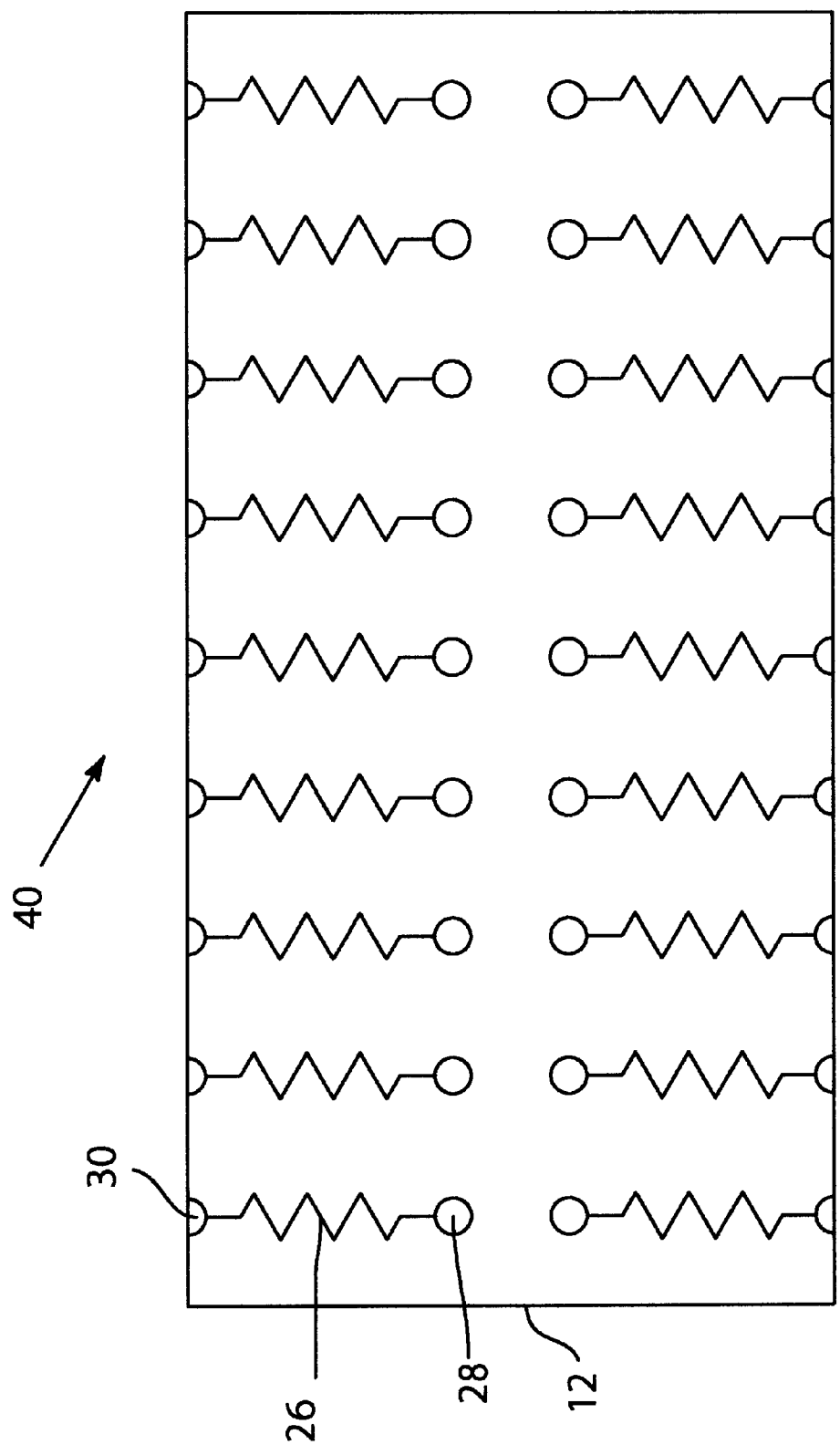
FIG. 5 is a schematic diagram of the circuit of FIG. 1.

FIG. 5 is a schematic diagram 40 of array resistor network assembly 10 showing the resulting resistances in the network.

Figure 6:
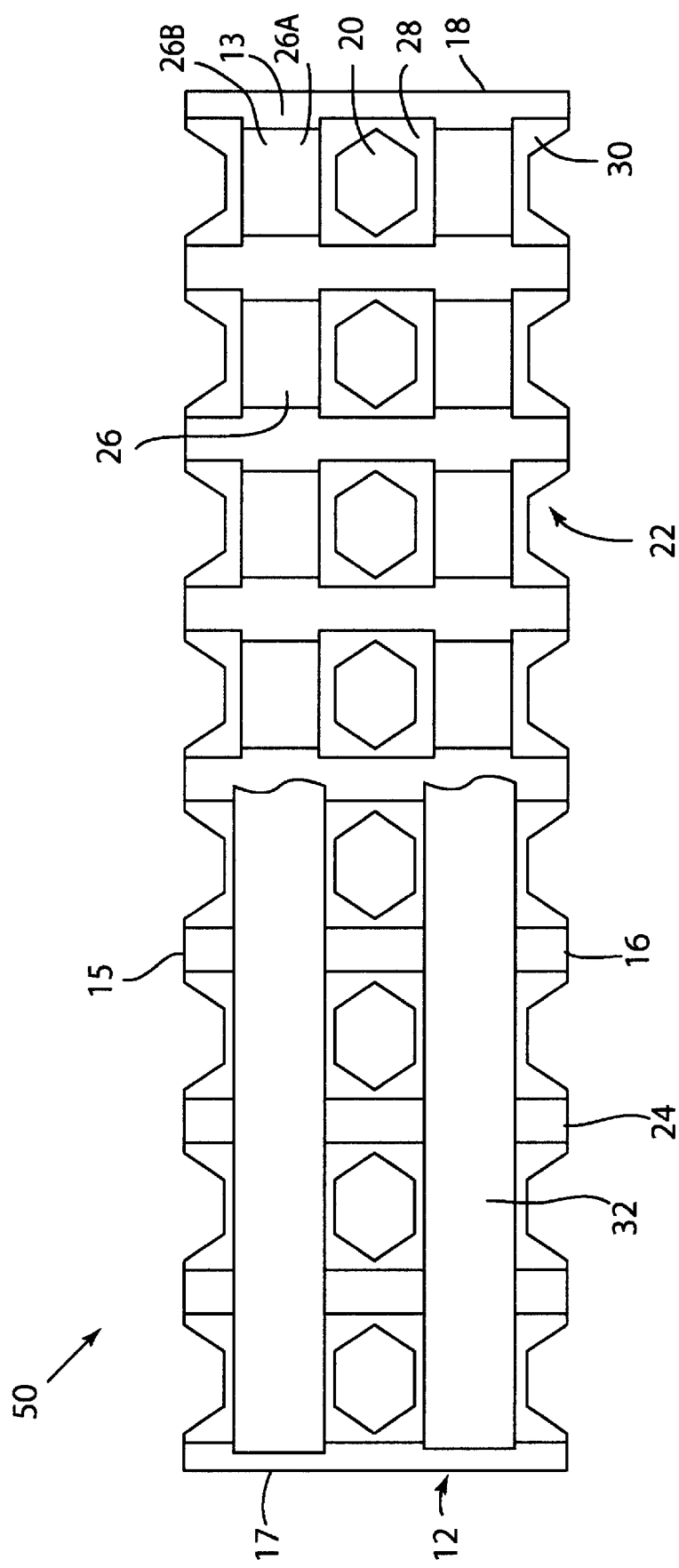
FIG. 6 is a top view of an alternative embodiment of an array resistor network.
Figure 7:
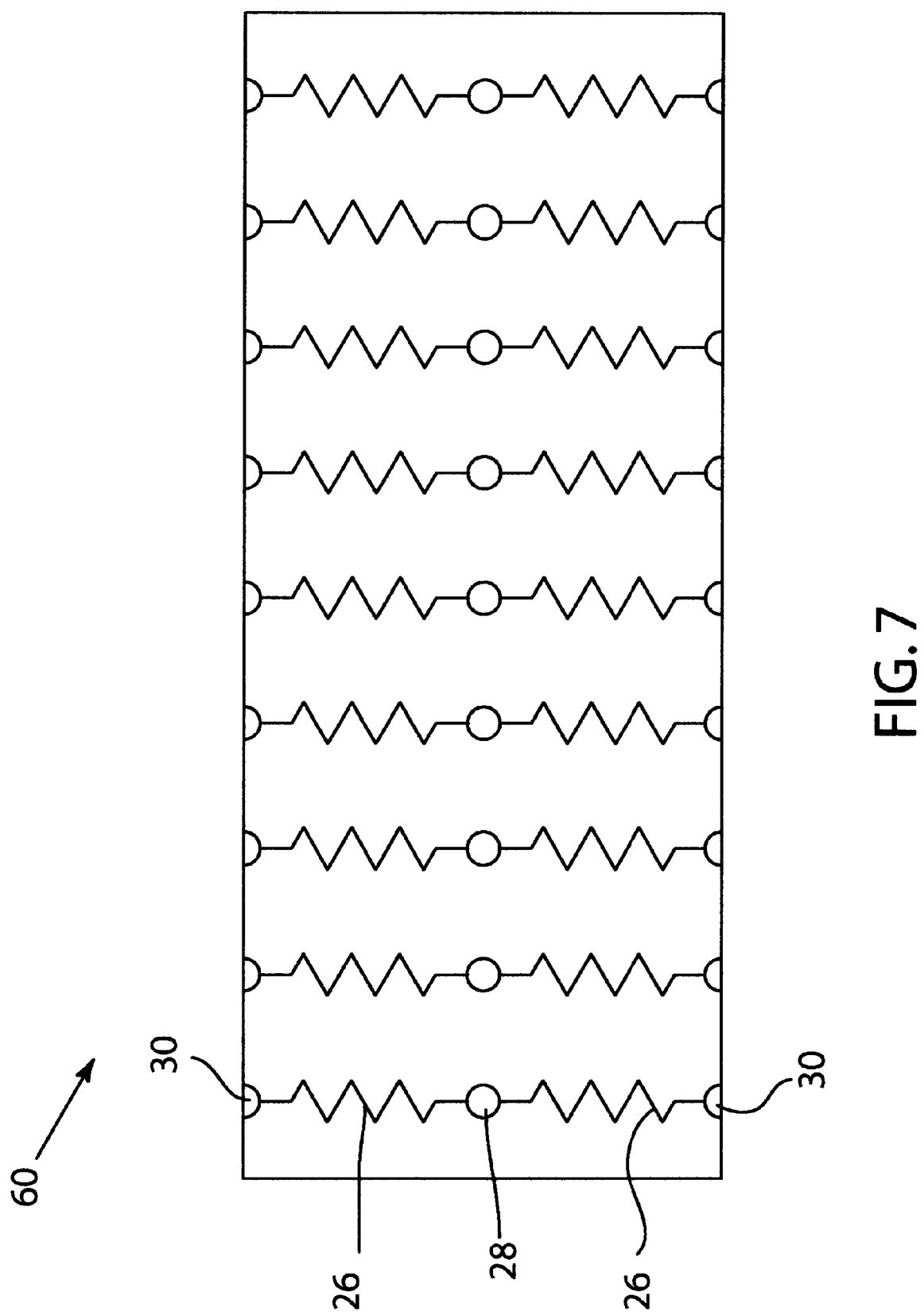
FIG. 7 is a schematic diagram of the circuit of FIG. 6.

FIG. 6 shows an alternative embodiment of an array resistor network assembly 50. Network assembly 50 is similar to network assembly 10 except that only one row of apertures 20 and conductors 28 are present. FIG. 7 shows the resulting schematic diagram 60 for array resistor network assembly 50.

Figure 8:
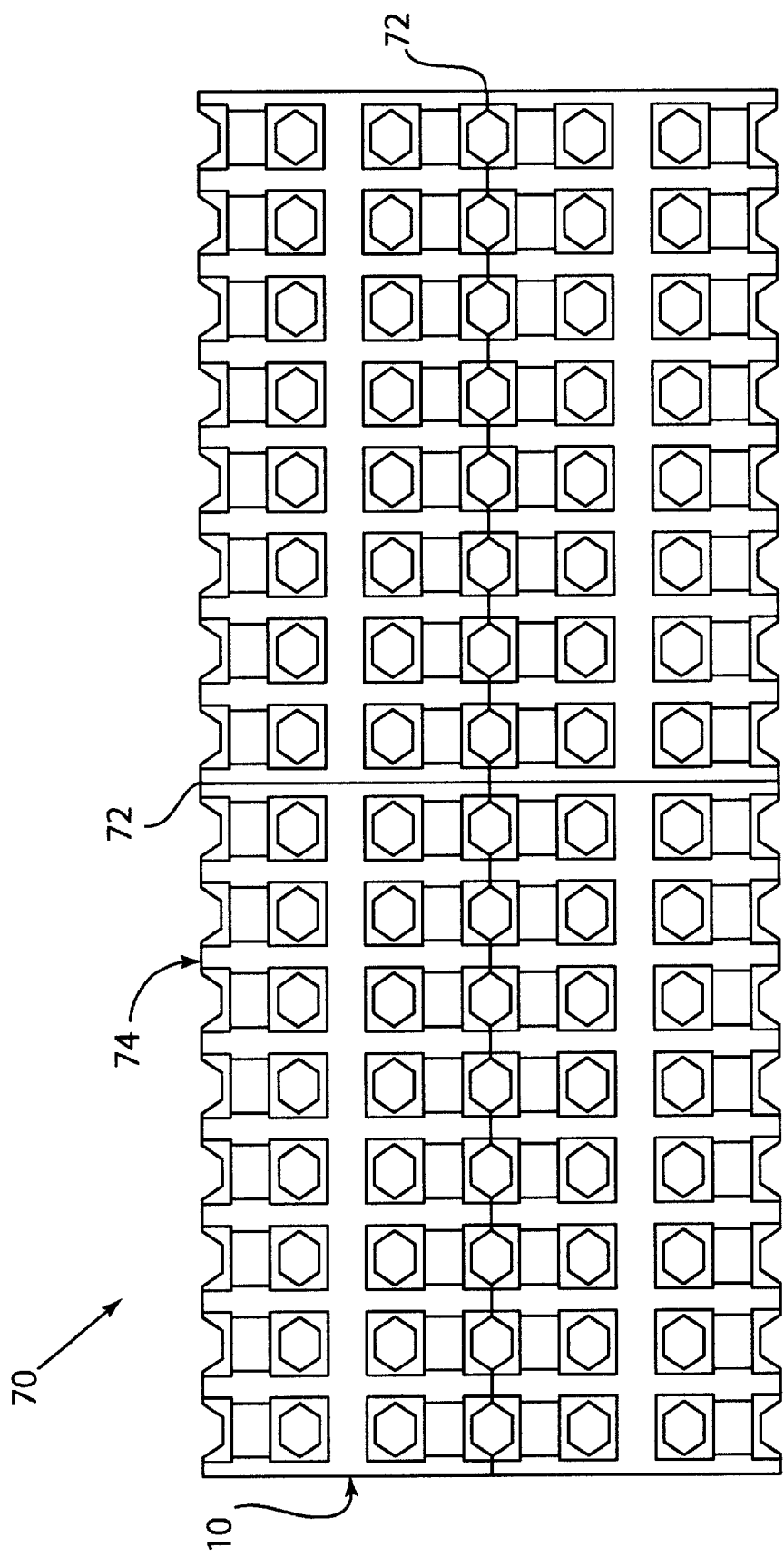
FIG. 8 is a top view of a group of array resistor networks during manufacturing prior to being divided into individual resistor networks.

Turning now to FIG. 8, a top view of a group 70 of array resistor networks during manufacturing prior to being divided into individual resistor networks 10. Individual array resistors networks 10 are fabricated on a common ceramic substrate 74. Substrate 74 has scribe lines 72 formed thereon. After all of the resistor networks are formed on substrate 74 during manufacturing, the individual resistor networks would be broken off or singulated by bending substrate 74 along scribe lines 72. When stress is applied to substrate 74 it breaks along scribe lines 72.

Resistor network assembly 10 would be manufactured by the following process sequence:
1. Conductor layers 28A and 30A are screened or vacuum pulled onto the side walls 21 of aperture 20 and recess 22 of substrate 74 and dried.
2. Conductor layers 28A and 30A are screened onto top surface 13 and dried.
3. Conductor layers 28A and 30A are screened onto bottom surface 14 and dried.
4. Conductor layers 28A and 30A are fired in an oven.
5. Resistors 26 are screened onto top surface 13 of substrate 74 and dried.
6. Resistors 26 are fired in an oven.
7. Resistors 26 are laser trimmed to their proper resistance value.
8. Cover coat 32 is screened over resistors 26.
9. Cover coat 32 is cured.
10. An identification marking is screened onto the cover coat and cured.
11. Assembly 70 is broken apart into multiple resistor networks 10.
12. Nickel layers 28B and 30B are electroplated onto layers 28A and 30A.
13. Solder layers 28C and 30C are electroplated onto nickel layers 28B and 30B.
14. The network is electrically tested.
15. The network is packaged for shipment.

If desired, other electrical elements could be added to array resistor networks 10 or 50 such as capacitors or inductors to make a filter, for example.

If desired, substrate 12 could be flipped over such that the resistors 26 are on the bottom. The network could then be reflowed with solder onto a printed circuit board.

The present invention has many advantages. For example, resistor network 10 provides a high density of resistors per unit area. Resistor network 10 can be manufactured at low cost because a large number can be fabricated at the same time in a multiple configuration on a common substrate 74 and then broken apart. Resistor network 10 is also low in cost because of a low number of manufacturing steps. Another advantage of resistor network 10 is that the short length of conductors 28 and 30 provides resistors have a low inductance. This leads to better impedance matching and lower cross-talk noise.

Another advantage of the present invention is that when the resistor network is soldered to a printed circuit board, the resulting solder joint extends along the conductor 30 in recess 22 providing a strong solder joint.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An array resistor network, comprising:
   a) a substrate having a first and a second surface and a first, second, third and fourth edge;
   b) a plurality of apertures extending through the substrate between the first and second surfaces;
   c) a plurality of recesses located in the first and second edges;
   d) at least one resistor disposed on the first surface, the resistor located between the recess and the apertures;
   e) at least one first conductor connected to a first end of the resistors, the first conductor located on the first surface and extending through the aperture onto the second surface; and
   f) a plurality of second conductors connected to a second end of the resistors, the second conductors located on the first surface and extending through the recess onto the second surface.

2. The array resistor network according to claim 1, wherein a cover coat is disposed over the resistors.

3. The array resistor network according to claim 1, wherein the first conductor surrounds the aperture.

4. The array resistor network according to claim 1, wherein first and second conductor have a silver layer, a nickel layer and a solder layer.

5. The array resistor network according to claim 1, wherein the substrate is ceramic.

6. The array resistor network according to claim 1, wherein the apertures are arranged in at least two rows parallel to the first and second edges.

7. The array resistor network according to claim 1, wherein a projection is located between the recesses.

8. An array resistor network, comprising:
   a) a planar substrate having a top and bottom surface;
   b) a first, second, third and fourth edge located on the substrate;
   c) at least one row of apertures extending through the substrate between the first and second surfaces;
   d) a plurality of recesses located in the first and second edges;
   e) a plurality of resistors located on the first surface, each resistor being located between the recess and the aperture;
   f) at least one first conductor connected to a first end of the resistors, the first conductor extending from the first end of the resistors through the aperture and onto the second surface, the first conductor surrounding the aperture; and
   g) a plurality of second conductors connected to a second end of the resistors, the second conductors extending from the second end of the resistors through the recess and onto the second surface.

9. The array resistor network according to claim 8, wherein a glass cover coat is disposed over the resistors.

10. The array resistor network according to claim 8, wherein first and second conductor have a silver layer located adjacent the substrate, a nickel layer overlaying the silver layer and a solder layer overlaying the nickel layer.

11. The array resistor network according to claim 8, wherein the substrate is ceramic.

12. The array resistor network according to claim 10, wherein the silver layer is applied as a thick film.

13. The array resistor network according to claim 12, wherein the nickel and solder layers are electroplated.

14. The array resistor network according to claim 8, wherein a projection is located between the recesses.

15. The array resistor network according to claim 13, wherein the composition of the solder ranges from 5–20% lead and from 80–95% tin.

* * * * *